United States Patent
Newman et al.

(10) Patent No.: US 9,969,541 B2
(45) Date of Patent: May 15, 2018

(54) VENTED CARRIER TAPE

(71) Applicant: QUALCOMM Incorporated, San Diego, CA (US)

(72) Inventors: Anthony Thomas Newman, San Diego, CA (US); Kevin Caffey, Cardiff-by-the-Sea, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/256,505

(22) Filed: Sep. 2, 2016

(65) Prior Publication Data

US 2017/0327286 A1    Nov. 16, 2017

Related U.S. Application Data

(60) Provisional application No. 62/336,604, filed on May 14, 2016.

(51) Int. Cl.
| B65D 73/00 | (2006.01) |
| B65D 71/50 | (2006.01) |
| B65D 85/42 | (2006.01) |
| H01L 21/683 | (2006.01) |

(52) U.S. Cl.
CPC ......... *B65D 73/0035* (2013.01); *B65D 71/50* (2013.01); *B65D 85/42* (2013.01); *H01L 21/6836* (2013.01); *H01L 2221/6834* (2013.01)

(58) Field of Classification Search
CPC .... B65D 73/0035; B65D 71/50; B65D 85/42; H01L 21/6836; H01L 2221/6834

USPC .................................................. 206/701–719
See application file for complete search history.

(56) References Cited

U.S. PATENT DOCUMENTS

| 5,690,233 | A | * | 11/1997 | Kaneko | .............. | H05K 13/0084 |
| | | | | | | 206/713 |
| 5,769,236 | A | * | 6/1998 | Maruyama | ......... | H05K 13/0417 |
| | | | | | | 206/713 |
| 5,846,621 | A | | 12/1998 | Nagamatsu | | |
| 5,956,925 | A | | 9/1999 | Ruble, III | | |
| 6,076,681 | A | * | 6/2000 | Chenoweth | ........ | H05K 13/0417 |
| | | | | | | 206/714 |
| 6,216,419 | B1 | * | 4/2001 | Sakurai | ................... | B65B 9/045 |
| | | | | | | 206/713 |
| 6,270,614 | B1 | | 8/2001 | Naito et al. | | |
| 6,536,593 | B2 | * | 3/2003 | Hatakeyama | .......... | B65D 73/02 |
| | | | | | | 206/714 |
| 7,455,896 | B2 | * | 11/2008 | Fujimura | ............ | H05K 13/0084 |
| | | | | | | 206/710 |
| 8,196,278 | B2 | | 6/2012 | Nakashima et al. | | |
| 2004/0011700 | A1 | * | 1/2004 | Brahmbhatt | ....... | H05K 13/0084 |
| | | | | | | 206/713 |
| 2008/0087572 | A1 | * | 4/2008 | Wihren | .............. | H05K 13/0084 |
| | | | | | | 206/714 |

* cited by examiner

*Primary Examiner* — Chun Cheung
(74) *Attorney, Agent, or Firm* — Muncy, Geissler, Olds & Lowe, P.C.

(57) ABSTRACT

A carrier tape may include a tape, a plurality of pockets, and a plurality of vents in each of the plurality of pockets. The plurality of vents may provide a vapor egress path for vapor that may occur during a dry bake process of the carrier tape.

27 Claims, 4 Drawing Sheets

VENTED CARRIER TAPE

CLAIM OF PRIORITY UNDER 35 U.S.C. § 120

The present application for patent claims priority to U.S. Provisional Patent Application No. 62/336,604, entitled "VENTED CARRIER TAPE," filed May 14, 2016, assigned to the assignee hereof, and expressly incorporated herein by reference in its entirety.

FIELD OF DISCLOSURE

This disclosure relates generally to carrier tape, and more specifically, but not exclusively, to vented carrier tapes.

BACKGROUND

Carrier Tapes help protect electrical and electronic components during processing such as a dry bake, shipping, and storage. Precisely formed pockets minimize tilt, flip and migration of components during processing and while in transport. Conventional carrier tapes are not well-suited for dry bake. While there are "bakeable" tape and reel materials available, these do not address one fundamental issue: the lack of a vapor egress path. Devices in conventional tape and reel pockets are enclosed on all 6 sides by carrier tape walls or by cover tape. During the device dry baking process, the IC device and carrier tape material may release water vapor through evaporation, but the vapor coming out of the device or nearby tape material is not carried away because it is completely enclosed. Accordingly, when the tape and reel is cooled after this baking process, the moisture is reabsorbed into the devices and surrounding tape material.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a carrier tape comprises: a tape; a plurality of pockets in the tape, each of the plurality of pockets spaced apart near a first side of the tape along a longitudinal axis of the tape; and a plurality of second holes in each of the plurality of pockets.

In another aspect, a carrier tape comprises: a tape; a plurality of first means for holding one of a plurality of components, each of the plurality of first means spaced apart near a first side of the tape along a longitudinal axis of the tape; and a plurality of third means for creating a plurality of air flow paths in each of the first means.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
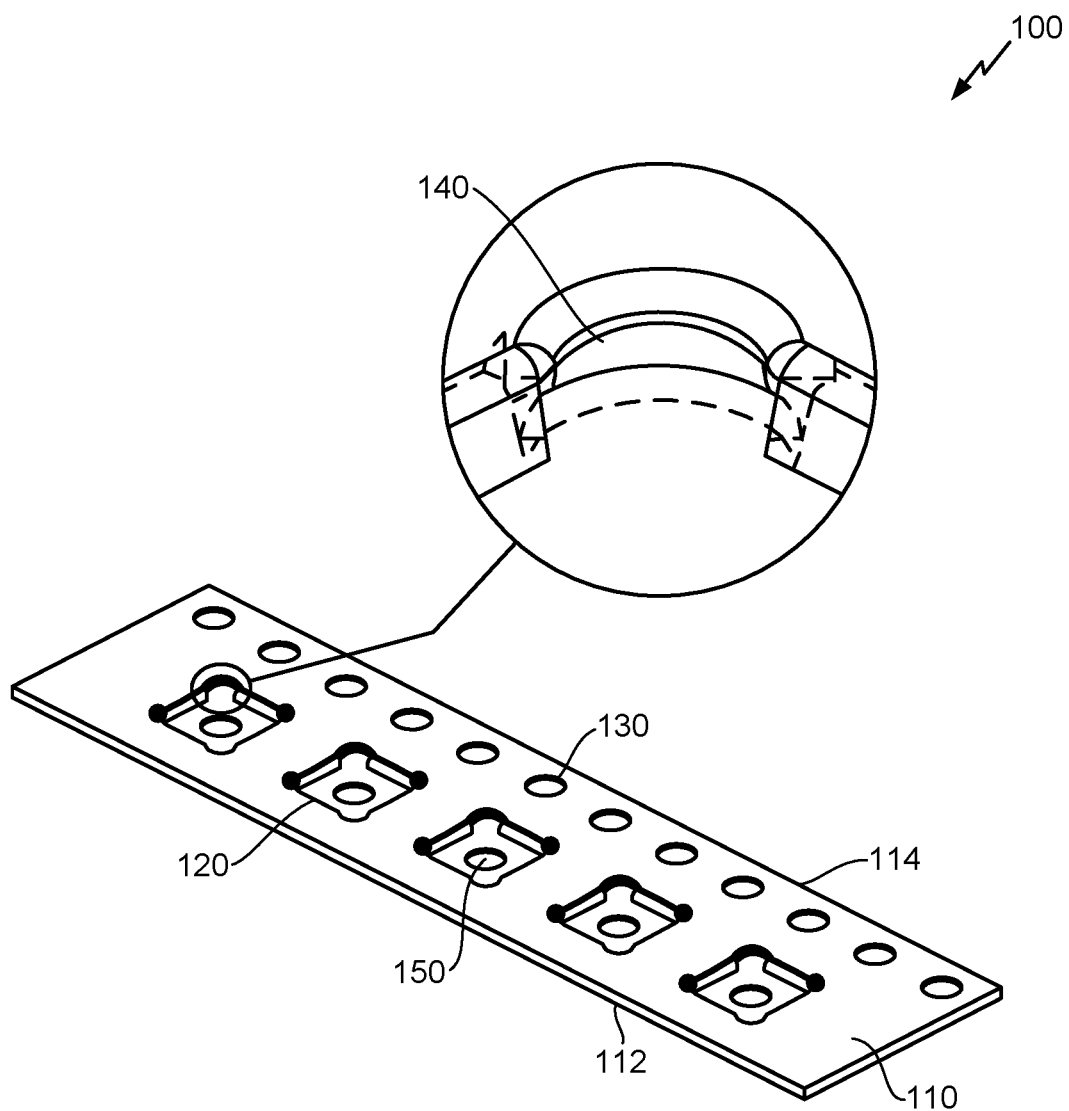
FIG. 1 illustrates an exemplary carrier tape in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein address the industry needs, as well as other previously unidentified needs, and mitigate shortcomings of the conventional methods, apparatus, and systems. For example, a carrier tape according to some examples of the disclosure may include a tape, a plurality of pockets in the tape, and wherein each of the plurality of pockets has at least one vent configured to allow air to flow out of the respective one of the plurality of pockets. In one example, each of the plurality of pockets may have a vent or hole in each corner configured to enable water vapor to escape and to be carried away by natural or forced convection during a dry baking process. The air surrounding the device in each pocket will be dehydrated and thus will remain dry even after cooling. This will improve the effectiveness of the dry baking process by preventing reabsorption of water vapor. In addition, by providing a vent or hole in a sidewall of the pocket, the vapor will still escape while to carrier tape is wound around a spool for storage, transportation, or use as opposed to having the vent or hole in the bottom of the pocket where the bottom will be sealed by the carrier tape layer under the pocket of interest.

FIG. 1 illustrates an exemplary carrier tape in accordance with some examples of the disclosure. As shown in FIG. 1, a carrier tape 100 may include a tape 110 with a plurality of pockets 120 spaced apart near a first side 112 of the tape 110 and along a longitudinal axis of the tape 110 and a plurality of first holes 130 spaced apart near a second side 114 of the tape 110 opposite the first side 112 and along the longitudinal axis of the tape 110. The tape 110 may comprise a polycarbonate, a polyethene terephthalate (PET), a polystyrene (PS), a polyvinyl chloride (PVC), a thermoplastic polymer, or similar material configured to maintain its integrity and withstand a baking process that exposes the tape 110 to temperatures of 55 degrees C. or higher. For example, a dry bake process may expose the tape 110 to a temperature of 55 degrees C. for several days or to a higher temperature such as 125 degrees C. for a shorter amount of time. The plurality of first holes 130 may be optional and may be configured to align the tape 110 for machine processing during placement of a plurality of components 170 (not shown in FIG. 1) corresponding ones of the plurality of pockets 120 and retrieval of the same. The plurality of pockets 120 may be square shaped and may be configured to securely hold a plurality of components 170 (not shown in FIG. 1), such as an electrical device, an electronic device, an integrated circuit device, or a semiconductor device. Each of the plurality of pockets 120 may be spaced apart from one another such that the number of pockets per meter is defined by the pocket pitch. For example, the range of pocket pitches may be 2 to 56 mm, so the number of pockets 120 per meter of tape 110 may range from 17 to 500.

Each of the plurality of pockets 120 may include a plurality of second holes 140 and one of a plurality of third holes 150. Each of the plurality of third holes 150 may be optional and may be located in a bottom of a corresponding one of the plurality of pockets 120. The plurality of third holes 150 may be configured to provide a location for applying a negative pressure (vacuum) that aids in securing a corresponding one of the plurality of components 170 (not shown in FIG. 1) in the plurality of pockets 120 during processing and transportation. The plurality of second holes 140 may be located in each of the corners of each of the plurality of pockets 120 and may be configured to provide a vapor egress path out of the corresponding one of the plurality of pockets 120. However, it should be understood that each of the plurality of pockets 120 may include more or less than four of the plurality of second holes and, alternatively, each of the plurality of second holes may be located in any of the side walls of each of the plurality of pockets 120. The plurality of second holes 140 in the corners of the plurality of pockets 120 provide a path by which water vapor that is escaping the component during a dry bake process may be carried away from the component by natural or forced convection preventing reabsorption of the water vapor when the component is cooled after the dry baking process. Each of the plurality of second holes 140 may be configured to allow adequate airflow, such as a square, circle, or oval with an approximate vertical width of 0.5 mm, for example. However, it should be understood that the vertical width of each of the plurality of second holes 140 may not be the same and may be a percentage of a second vertical width 118 (shown in FIG. 2) such as 50 percent, 45 percent, 30 percent, 16 percent, etc. In addition, by locating the plurality of second holes 140 in sidewalls of each of the plurality of pockets 120, the vapor will still escape while the carrier tape 100 is wound around a spool for storage, transportation, or use as opposed to the plurality of third holes 150 in the bottom of the pocket where the bottom will be sealed by the carrier tape layer under the pocket of interest.

Figure 2:
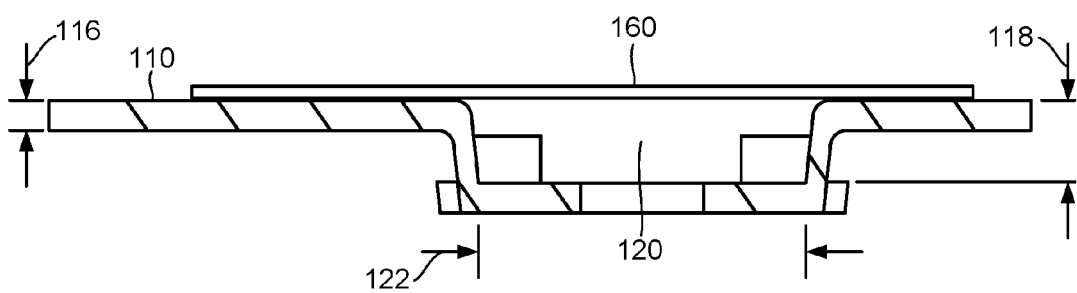
FIG. 2 illustrates a side view of an exemplary carrier tape in accordance with some examples of the disclosure.

FIG. 2 illustrates a side view of an exemplary carrier tape in accordance with some examples of the disclosure. As shown in FIG. 2, the carrier tape 100 may include a cover material 160 enclosing each of the plurality of pockets 120 to seal the component in each one of the plurality of pockets 120. The tape 110 may have a first vertical width 116 of 0.3 mm from a top of the tape 110 to a bottom of the tape 110, a second vertical width 118 of 0.6 mm from the top of the tape 110 to the bottom of the plurality of pockets 120, and a third horizontal width 122 of 1 mm from one side of a pocket 120 to an opposite side of the pocket 120. However, it should be understood that these dimensions are by way of example only and that the carrier tape 100 dimensions may conform to the ANSI/EIA-481-D standard (expressly incorporated herein by reference). For example, the carrier tape 100 may have the following dimensions: pocket width (A0): 0.36 to 45.60 mm, pocket length (B0): 0.66 to 45.60 mm, pocket depth (K0): 0.33 to 29.20 mm, pocket pitch (P1): 2 to 56 mm, and tape width (W): 8 to 200 mm.

Figure 3:
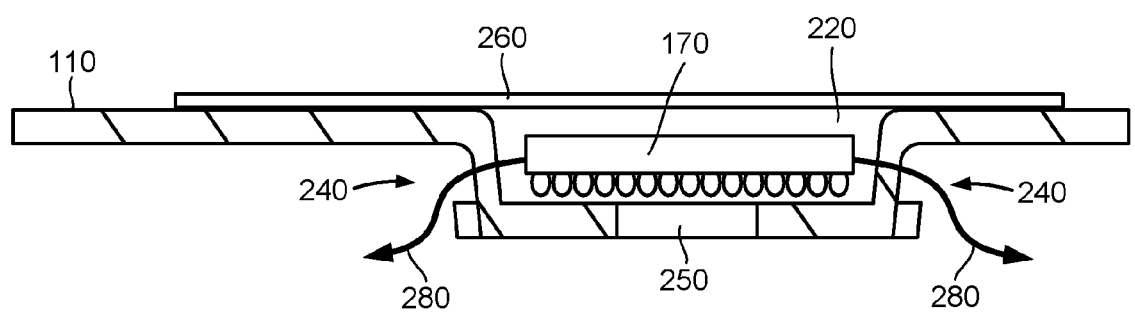
FIG. 3 illustrates a side view of an exemplary carrier tape and a component in accordance with some examples of the disclosure.

FIG. 3 illustrates a side view of an exemplary carrier tape and a component in accordance with some examples of the disclosure. As shown in FIG. 3, a carrier tape 100 may include a tape 110, a first means 220 for holding one of a plurality of components (e.g. a plurality of pockets 120), a second means 260 for covering the first means (e.g. cover material 160) on a top of each of the first means 220, a plurality of components 170 with one of the plurality of components 170 in each of the first means 220. The second means 260 may be configured to seal the plurality of components 170 in the first means 220 and may comprise an antistatic, transparent, heat sealable polyester cover film or similar material configured to maintain its integrity and withstand a dry baking process as well as adhere to the tape 110 material. Each of the plurality of components 170 may be an electrical device, an electronic device, an integrated circuit device, or a semiconductor device, for example. Each of the first means 120 may have a plurality of third means 240 (e.g. the plurality of second holes 140) configured to create a plurality of air flow paths 280 from each of the first means 220 to vent vapors that may occur during a dry back process. Each of the first means 220 may also include an optional fourth means 250 (e.g. the plurality of third holes 150) in a bottom surface of each of the first means 220 configured to allow a negative pressure applied to the fourth means 250 to securely hold each of the plurality of components 170 in the corresponding one of the first means 220 during processing, transportation, and storage to prevent rotation, flipping, or movement of the plurality of components 170.

Figure 4:
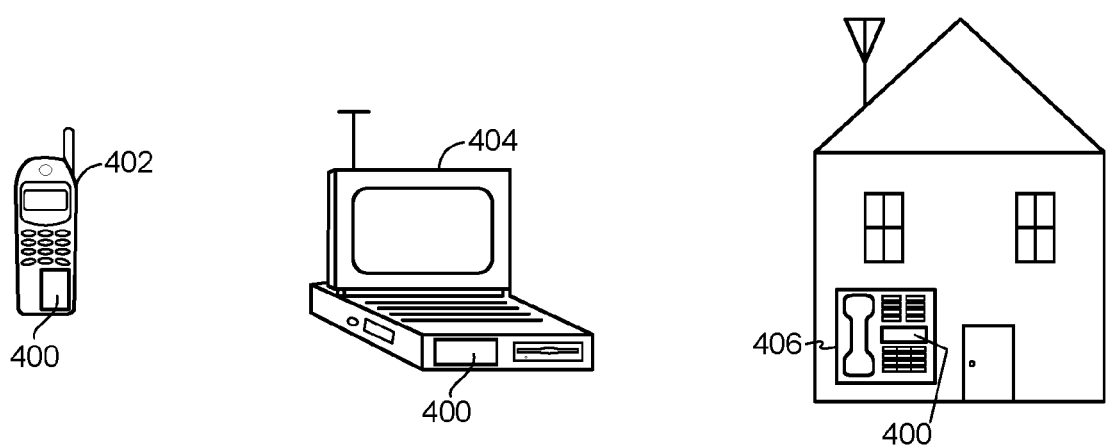
FIG. 4 illustrates various electronic devices that may be integrated with the aforementioned integrated device, semiconductor device, integrated circuit, or die in accordance with some examples of the disclosure.

FIG. 4 illustrates various electronic devices that may be integrated with any of the aforementioned plurality of components 170, such as an integrated device, semiconductor device, integrated circuit, or die in accordance with some examples of the disclosure. For example, a mobile phone device 402, a laptop computer device 404, and a fixed location terminal device 406 may include an integrated device 400 as described herein. The integrated device 400 may be, for example, any of the integrated circuits, dies, or integrated devices described herein. The devices 402, 404, 406 illustrated in FIG. 4 are merely exemplary. Other electronic devices may also feature the integrated device 400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1, 2, 3, and/or 4 may be rearranged and/or combined into a single component, process, feature or function or embodied in several components, processes, or functions. Additional elements, components, processes, and/or functions may also be added without departing from the disclosure. It should also be noted that FIGS. 1, 2, 3A-D, 4 and/or 5 and its corresponding description in the present disclosure is not limited to dies and/or ICs. In some implementations, FIGS. 1, 2, 3, and/or 4 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A carrier tape, comprising:
    a tape;
    a plurality of pockets in the tape, the plurality of pockets spaced apart near a first side of the tape along a longitudinal axis of the tape, and wherein each of the plurality of pockets is square shaped with bulged outward corners; and a plurality of second holes in each of the plurality of pockets, one of the plurality of second holes located in each of the bulged outward corners of the plurality of pockets.

2. The carrier tape of claim 1, further comprising a plurality of first holes in the tape, each of the plurality of first holes spaced apart near a second side of the tape opposite the first side of the tape along the longitudinal axis of the tape.

3. The carrier tape of claim 1, wherein the tape comprises one of a polycarbonate, a polyethylene terephthalate, a polystyrene, a polyvinyl chloride, or a thermoplastic polymer configured to withstand temperatures of at least 55 degrees C.

4. The carrier tape of claim 1, wherein each of the plurality of pockets is configured to securely hold one of an electrical device, an electronic device, an integrated circuit device, or a semiconductor device.

5. The carrier tape of claim 1, wherein each of the plurality of pockets is spaced apart from one another such that there are at least 17 of each of the plurality of pockets per meter of tape.

6. The carrier tape of claim 1, further comprising one of a plurality of third holes in each of the plurality of pockets, each of the plurality of third holes is located in a bottom of a corresponding one of the plurality of pockets.

7. The carrier tape of claim 1, wherein one of the plurality of second holes is configured to provide a vapor egress path out of the corresponding one of the plurality of pockets.

8. The carrier tape of claim 1, wherein each of the plurality of second holes is one of a square, a circle, or an oval with an approximate width of 0.5 mm.

9. The carrier tape of claim 1, further comprising a cover material on a top of each of the plurality of pockets.

10. A carrier tape, comprising:
a tape;
a plurality of first means for holding one of a plurality of components, each of the plurality of first means spaced apart near a first side of the tape along a longitudinal axis of the tape, and wherein each of the plurality of first means is square shaped with bulged outward corners; and
a plurality of third means for creating a plurality of air flow paths in each of the plurality of first means, one of the plurality of third means located in each of the bulged outward corners of the plurality of first means.

11. The carrier tape of claim 10, further comprising a plurality of holes in the tape, each of the plurality of holes spaced apart near a second side of the tape opposite the first side of the tape along the longitudinal axis of the tape.

12. The carrier tape of claim 10, wherein the tape comprises one of a polycarbonate, a polyethylene terephthalate, a polystyrene, a polyvinyl chloride, or a thermoplastic polymer configured to withstand temperatures of at least 55 degrees C.

13. The carrier tape of claim 10, wherein each of the plurality of first means is configured to securely hold one of an electrical device, an electronic device, an integrated circuit device, or a semiconductor device.

14. The carrier tape of claim 10, wherein each of the plurality of first means is spaced apart from one another such that there are at least 17 of each of the plurality of first means per meter of tape.

15. The carrier tape of claim 10, further comprising one of a plurality of fourth means for holding one of an electrical device, an electronic device, an integrated circuit device, or a semiconductor device in each of the plurality of first means, each of the plurality of fourth means is located in a bottom of a corresponding one of the plurality of first means.

16. The carrier tape of claim 10, wherein one of the plurality of third means is configured to provide a vapor egress path out of the corresponding one of the plurality of first means.

17. The carrier tape of claim 10, wherein each of the plurality of third means is one of a square, a circle, or an oval with an approximate width of 0.5 mm.

18. The carrier tape of claim 10, further comprising a plurality of second means for sealing each of the plurality of first means on a top of each of the plurality of first means.

19. A carrier tape, comprising:
a tape;
a plurality of pockets in the tape, the plurality of pockets spaced apart near a first side of the tape along a longitudinal axis of the tape, and wherein each of the plurality of pockets is square shaped with bulged outward corners; and
a plurality of second holes in each of the plurality of pockets, one of the plurality of second holes located in one of the bulged outward corners of the plurality of pockets, each of the plurality of second holes having a vertical width and a horizontal width.

20. The carrier tape of claim 19, wherein the vertical width is between approximately 0.1 mm and 0.5 mm and the horizontal width is between approximately 0.1 mm and 0.9 mm.

21. The carrier tape of claim 20, wherein the tape comprises one of a polycarbonate, a polyethylene terephthalate, a polystyrene, a polyvinyl chloride, or a thermoplastic polymer configured to withstand temperatures of at least 55 degrees C.

22. The carrier tape of claim 20, wherein each of the plurality of pockets is configured to securely hold one of an electrical device, an electronic device, an integrated circuit device, or a semiconductor device.

23. The carrier tape of claim 20, wherein each of the plurality of pockets is spaced apart from one another such that there are at least 17 of each of the plurality of pockets per meter of tape.

24. The carrier tape of claim 20, further comprising one of a plurality of third holes in each of the plurality of pockets, each of the plurality of third holes is located in a bottom of a corresponding one of the plurality of pockets.

25. The carrier tape of claim 20, wherein one of the plurality of second holes is configured to provide a vapor egress path out of the corresponding one of the plurality of pockets.

26. The carrier tape of claim 20, wherein each of the plurality of second holes is one of a square, a circle, or an oval with an approximate width of 0.5 mm.

27. The carrier tape of claim 20, further comprising a cover material on a top of each of the plurality of pockets.

* * * * *